United States Patent
Bergstedt et al.

(10) Patent No.: US 6,266,016 B1
(45) Date of Patent: Jul. 24, 2001

(54) MICROSTRIP ARRANGEMENT

(75) Inventors: Leif Bergstedt, Sjömarken; Spartak Georgian, Göteborg, both of (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/686,637

(22) Filed: Oct. 11, 2000

Related U.S. Application Data

(62) Division of application No. 09/196,165, filed on Nov. 20, 1998.

(30) Foreign Application Priority Data

Nov. 21, 1997 (SE) .................................................. 9704296

(51) Int. Cl.[7] .................................................. H01Q 1/38
(52) U.S. Cl. .................................. 343/700 MS; 343/848
(58) Field of Search ........................... 343/700 MS, 846, 343/848; 333/246, 238

(56) References Cited

U.S. PATENT DOCUMENTS

| | | | |
|---|---|---|---|
| 4,494,083 | 1/1985 | Josefsson et al. | 333/33 |
| 4,521,755 | 6/1985 | Carlson et al. | 333/244 |
| 4,614,922 | 9/1986 | Bauman et al. | 333/161 |
| 4,633,262 | 12/1986 | Traut | 343/700 MS |
| 4,719,470 * | 1/1988 | Munson | 343/700 MS |
| 4,918,457 | 4/1990 | Gibson | 343/700 MS |
| 5,386,214 | 1/1995 | Sugawara | 343/700 MS |
| 5,532,643 * | 7/1996 | Kuffner et al. | 343/700 MS |
| 5,929,728 * | 6/1999 | Barnett et al. | 333/239 |

FOREIGN PATENT DOCUMENTS

| | | |
|---|---|---|
| 0 671 777 | 9/1995 | (EP) . |
| 0 801 433 | 10/1997 | (EP) . |

* cited by examiner

*Primary Examiner*—Tan Ho
(74) *Attorney, Agent, or Firm*—Burns, Doane, Swecker & Mathis, L.L.P.

(57) ABSTRACT

The invention relates to a microstrip arrangement comprising a first and a second microstrip conductor. The two microstrip conductors have essentially the same dimensions in their longitudinal direction and transverse direction, and are galvanically interconnected by means of at least one connection. The two microstrip conductors also extend essentially parallel to one another on either side of a dielectric material. As a result of this design of the microstrip arrangement, the field losses and also other influences caused by the dielectric material will be very considerably reduced, and in practice a resultant microstrip arrangement is obtained, which, with regard to its electrical performance, appears to be suspended in the air. Preferred embodiments comprise a microstrip antenna, a circuit board and a conductor application.

9 Claims, 3 Drawing Sheets

MICROSTRIP ARRANGEMENT

RELATED APPLICATIONS

This application is a divisional application of application No. 09/196,165, filed Nov. 20, 1998, the contents of which are herein incorporated by reference.

TECHNICAL FIELD

The present invention relates to a microstrip arrangement, preferably for use in a circuit board or in an antenna arrangement.

STATE OF THE ART

Microstrip technology is commonly used in arrangements within higher frequency ranges, for example the microwave range. Microstrip arrangements usually comprise a plane layer of an electrically conductive material arranged on a substrate of dielectric material. Common areas of application for microstrip arrangements are antennas and also circuit technology within the microwave range.

An extremely important and cost-influencing parameter in previously known microstrip arrangements is the material that is used as dielectric substrate. The material for the dielectric substrate is extremely important in known microstrip arrangements on account of inter alia the field losses that occur in the dielectric. In order to minimize these field losses, it has been necessary to use relatively expensive dielectric materials in previously known microstrip arrangements.

In conventional circuit board technology, for reasons of cost, use is made of dielectric materials which for inter alia the abovementioned reason are not suitable as a dielectric in microstrip arrangements. These inexpensive dielectric materials also have the disadvantage that their dielectric properties are not always the same at all points in one and the same circuit board.

In circuit board applications, it is also desirable for a conductor to be accessible from the outside of the circuit board. As conventional microstrip technology often makes use of a conductor that is "buried" in the dielectric, access to the conductor is rendered difficult.

A further problem with dielectric materials in microstrip conductors may be material variations between different deliveries of one and the same dielectric material from one and the same manufacturer.

One known way of reducing the field losses in the dielectric substrate in a microstrip arrangement is to provide the electrically conductive material with a non-plane design. A disadvantage of this solution is that a non-plane design drives up the manufacturing cost. Certain losses also occur in the electrically conductive material itself, compared with when the material is of plane design.

Another type of loss that may arise on account of the properties of the dielectric material is reflection losses, in other words losses at the point where the microstrip arrangement is connected to other equipment, in the case of an antenna especially transmitting or receiving equipment.

American Patent U.S. Pat. No. 4,521,755 discloses an arrangement which aims to improve the electrical properties in a transmission line made using strip line technology. This arrangement is dependent for its function on being positioned in a longitudinal cavity formed in a solid metal piece, which would seem to have the effect of making the arrangement bulky as well as costly to manufacture. The arrangement also requires the use of relatively expensive dielectric material, for example RT/DUROID 6010®.

DESCRIPTION OF THE INVENTION

A problem that is solved by means of the present invention is therefore that of minimizing, in an arrangement made using microstrip technology, the field losses that are caused by the dielectric material on which the conductive material is arranged.

Another problem that is solved by means of the present invention is that of minimizing the influence of material variations in the dielectric material in a microstrip arrangement.

A further problem that is solved by means of the present invention is that of reducing the reflection losses that arise in a microstrip arrangement.

By solving the abovementioned problems, it is possible to make use, in microstrip arrangements, of the type of dielectric that is used in conventional circuit board technology. As a result of this, microwave circuits can be connected to microstrip arrangements arranged on circuit boards that are manufactured using conventional circuit board technology. Furthermore, microstrip antennas can be manufactured using conventional circuit board technology. The manufacturing costs for said types of arrangement are thus reduced substantially.

These problems are solved by means of a microstrip arrangement that comprises a first and a second microstrip conductor. The two microstrip conductors have essentially the same dimensions in their longitudinal direction and transverse direction, and are galvanically interconnected by means of at least one connection. The two microstrip conductors also extend essentially parallel to one another on either side of a dielectric material.

As a result of this design of the microstrip arrangement, the field losses and also other influences caused by the dielectric material will be very considerably reduced, and in practice a resultant microstrip arrangement is obtained, which, with regard to its electrical performance, appears to be suspended in the air.

The microstrip arrangement also comprises one or more ground planes which extend essentially parallel to a plane defined by the extension of the two microstrip conductors in the longitudinal direction and transverse direction.

In a preferred antenna application, use is made of the microstrip arrangement according to the invention to excite radiating elements. In this application, ground planes are located parallel to the microstrip arrangement, on both its upper side and lower side. In the ground plane that is located on the same side of the microstrip arrangement as the radiating elements, there are apertures, above which apertures the radiating elements are located.

Measurements on this type of microstrip arrangement have also demonstrated considerably reduced reflection losses compared with previously known microstrip arrangements. The reduction is of the order of magnitude of 6 dB.

DESCRIPTION OF THE DRAWINGS

The invention will be described in greater detail below with the aid of examples of embodiments, and with reference to the attached drawings, in which.

PREFERRED EMBODIMENTS

Figure 1:
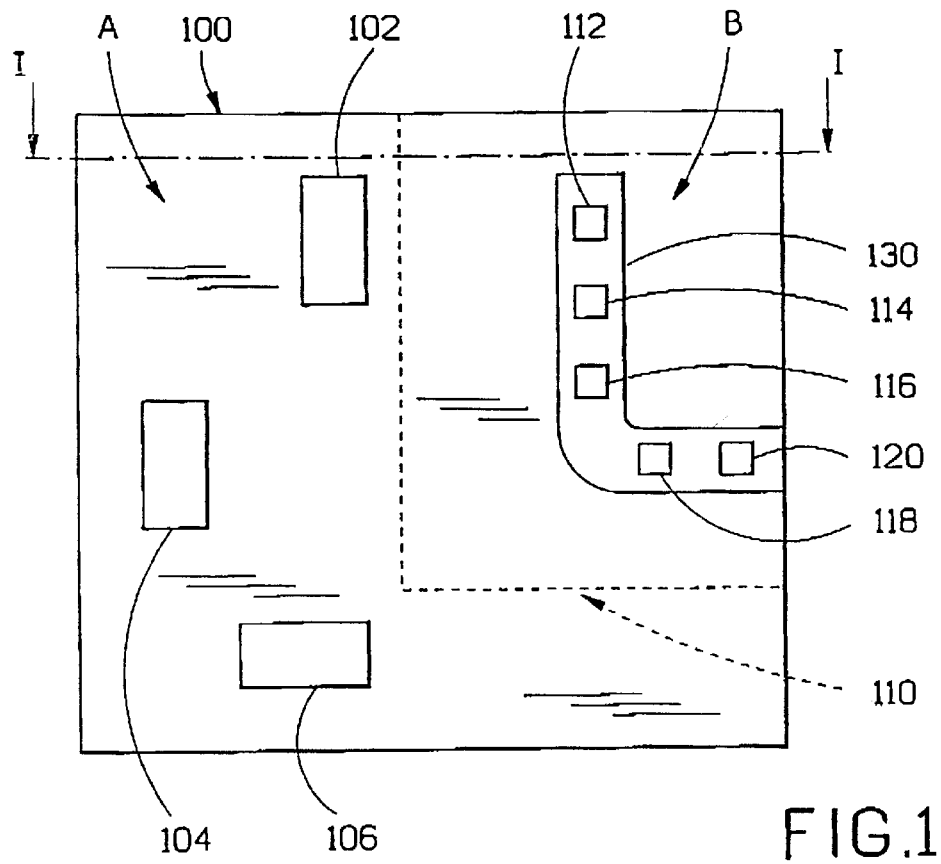
FIG. 1 shows a plan view from above of a circuit board in which the present invention is used.

FIG. 1 shows a plan view from above of a circuit board 100 in which a microstrip arrangement 130 according to the invention is used. The circuit board is divided into two parts, designated A and B. Part A is used for mounting circuits 102, 104 and 106 intended for frequency ranges below the microwave range, and part B is used for high-frequency circuits 112, 114, 116, 118, 120, which are preferably microwave circuits. The microwave circuits are connected to the microstrip arrangement 130.

When a circuit board is used for circuits within such widely differing ranges as have been described above, it may be desirable to arrange electrical screening between different parts of the board, in the present case between the part of the board that is used for high-frequency circuits and other parts of the board. Such a screen 110 is shown in FIG. 1 by dashed lines. In one embodiment, the screen may consist simply of a layer of conductive material which is preferably connected to a ground plane forming part of the arrangement.

Figure 2:
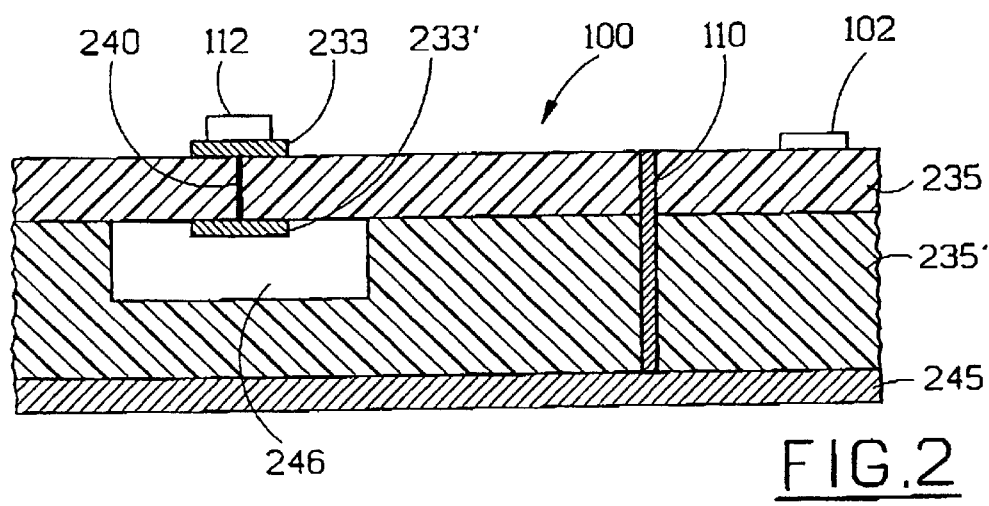
FIG. 2 shows a cross-section of the arrangement in FIG. 1, seen in a section along a part of line I—I.

FIG. 2 shows a cross-section of the circuit board 100 in FIG. 1, seen from the front in a section along a part of the line I—I. As can be seen from FIG. 2, the microstrip arrangement 130 according to the invention comprises a first microstrip conductor 233 and a second microstrip conductor 233' which have essentially the same dimensions in their longitudinal direction and transverse direction and are arranged essentially parallel to one another on either side of a first layer 235 of a dielectric material.

The microstrip arrangement 130 also comprises at least one electrical connection 240 between the two microstrip conductors. This connection 240 between the two microstrip conductors may be designed in a great many different ways. A suitable type of connection is via holes, in other words holes that are made with the aid of, for example, mechanical drilling, laser drilling or etching and are then made electrically conductive by plating with an electrically conductive material.

FIG. 2 shows an example in which the microstrip conductors 233, 233' are connected by means of via holes 240 along a line that constitutes an imaginary centre line in the two microstrip conductors. When this type of connection is used, the connections should not be located further from one another than λ/8, where λ is the central frequency in the waveband for which the antenna is intended.

FIG. 2 shows the connection 240 located essentially centrally in the conductors 233, 233' in relation to the longitudinal direction of the conductors. This positioning of the connection 240, and the fact that it extends through the dielectric substrate 235, are to be seen only as examples of its positioning. The connection 240 may be positioned in a great many other positions in relation to the microstrip conductors 233, 233', which will be described in greater detail below.

The arrangement 100 suitably also includes a first ground plane 245 which extends essentially parallel to a plane defined by the extension of the two microstrip conductors 233, 233' in the longitudinal direction and transverse direction. FIG. 2 shows the ground plane 245 separated from the most closely located microstrip conductor 233' by means of a second layer of dielectric material 235'. This second layer of dielectric material 235' may be designed as a layer which is separated from the first layer 235 of dielectric material or, alternatively, the two dielectric layers 235, 235' may be designed in one piece. If the two layers 235, 235' of dielectric material are designed as two separate layers, they do not necessarily have to be made of material with the same dielectric properties.

As is also shown in FIGS. 1 and 2, the first microstrip conductor 233 faces air on that of its surfaces which does not face the first dielectric material 235. In order to create symmetry in the microstrip arrangement 130 in this respect, in a preferred embodiment the second microstrip conductor 233' extends in a cavity 246 on that of its sides which does not face the first dielectric material 235. This symmetry is desirable but not necessary. An example of a possible asymmetrical construction is when one of the microstrip conductors, preferably the second microstrip conductor 233', extends in a dielectric material.

It is also possible to keep the ground plane 245 apart from the microstrip arrangement 130 and the first dielectric layer 235 using dielectric distance pieces.

The circuits 112, 114, 116, 118 and 120 may be connected to the circuits 102, 104, and 106 by means of via holes or conductors (not shown) on the surface of the circuit board. In this way, connections are brought about between RF circuits and circuits intended for lower frequency ranges.

Figure 3:
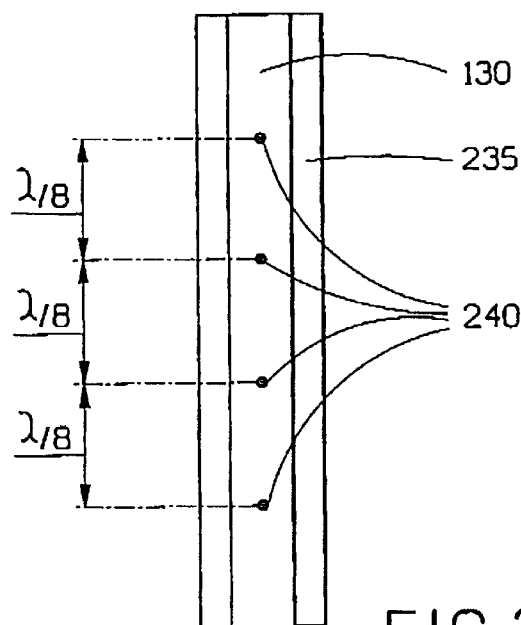
FIG. 3 is a diagrammatic sketch from above of the present invention.

FIG. 3 shows a diagrammatic sketch from above of an embodiment of a microstrip arrangement 130 according to the present invention. As can be seen from the drawing, the connections in this embodiment are located along a line that constitutes an imaginary centre line in the two microstrip conductors, at a maximum distance of roughly λ/8, where λ is the centre frequency in the waveband for which the microstrip arrangement 130 is intended.

Figure 4:
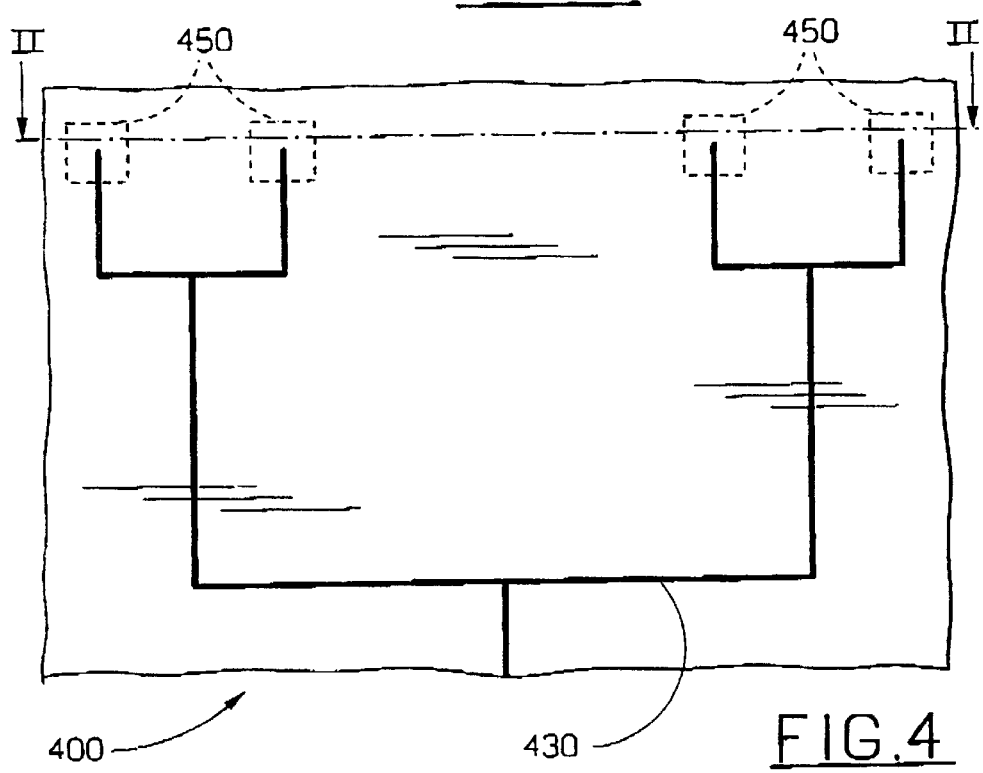
FIG. 4 shows a plan view from above of an antenna arrangement in which the present invention is used.

FIG. 4 shows a diagrammatic plan view from above of an antenna arrangement 400 in which a microstrip arrangement 430 according to the present invention is used. The radiating elements in the antenna arrangement 400 are rectangular patches 450, but the microstrip arrangement 430 according to the invention may in principle be used together with many different types of radiating element. In other words, the patches 450 are to be seen only as examples of radiating elements.

Figure 5:
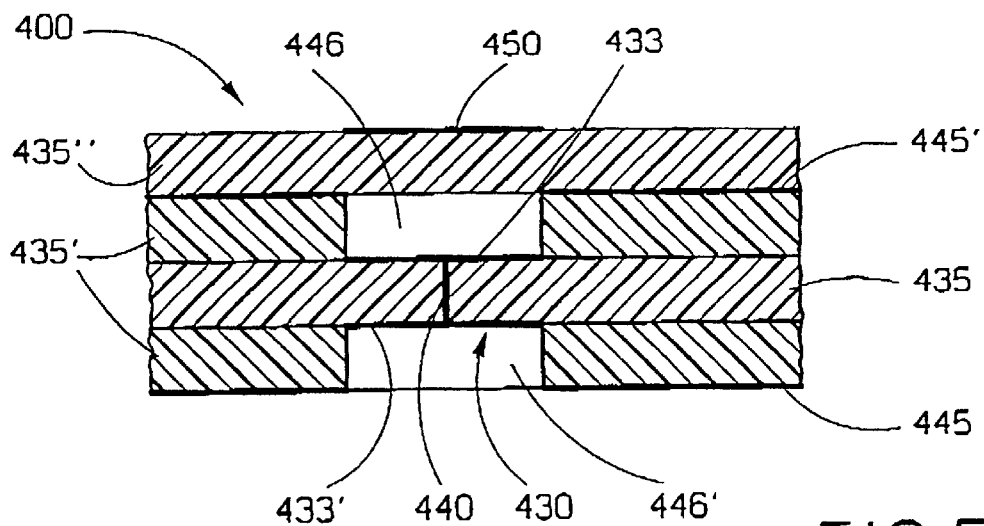
FIG. 5 shows a cross-section of the arrangement in FIG. 4, seen in a section along a part of line II—II.

FIG. 5 shows a cross-section of the arrangement in FIG. 4, seen from the front in a section along line II—II. As can be seen from the drawing, the antenna arrangement 400 in this embodiment comprises a first ground plane 445 and a second ground plane 445' which are arranged on either side of the microstrip arrangement 430 but separated from it by a first and second layer 435 and 435' respectively of a dielectric material.

The two layers 435, 435' of dielectric material may alternatively be made in the form of a continuous layer of one and the same material. If they are designed as two separate layers, they may be made of different materials.

The first and second ground planes 445 and 445' extend essentially parallel to a plane defined by the extension of the two microstrip conductors 433, 433' in the longitudinal and transverse direction.

The microstrip arrangement shown in FIGS. 4 and 5 also comprises one or more connections 440 between the two microstrip conductors 433, 433'. What has been said above with reference to the description of FIGS. 1–3 regarding the connection 240 between the two microstrip conductors according to the invention also applies in principle for a corresponding connection 440 in the embodiment shown in FIGS. 4 and 5. For this reason, the connection 440 will not be described further here.

As shown in FIG. 5, the two microstrip conductors 433, 433' face the first dielectric layer 435 with one of their surfaces. In the preferred embodiment shown in FIG. 5, that surface of the surfaces of the microstrip conductors 433, 433' which does not face the dielectric layer 435 extends in air cavities 446, 446' in the second layer of dielectric material 435'.

By virtue of the arrangement of the air cavities 446, 446', symmetry is brought about with regard to the materials that most closely surround the microstrip arrangement 430, a characteristic which is a desirable but not necessary. In alternative embodiments, one of the microstrip conductors may extend in a dielectric material while the other microstrip conductor extends in an air cavity or, alternatively, both microstrip conductors may extend in dielectric material.

As shown in FIG. 5, the patches 450 that form part of the antenna 400 are located in such a manner that they cover recesses in the second ground plane 445'. The recesses in the second ground plane are located essentially in front of the microstrip conductors 433, 433'. In this way, the patches 450 are excited by the microstrip arrangement 430. In the example shown, the patches are separated from the second ground plane by a third layer of dielectric material 435". Dimensioning of the recesses and the radiating elements can be made in a great many ways which are not described further here.

The fact that a microstrip arrangement according to the invention reduces the losses in dielectric material also affords other possibilities than those that have been described above. For example, in addition to the exemplary embodiments indicated above, a microstrip arrangement according to the invention may be used as an alternative to conventional microstrip conductors in a great many other applications.

Figure 6:
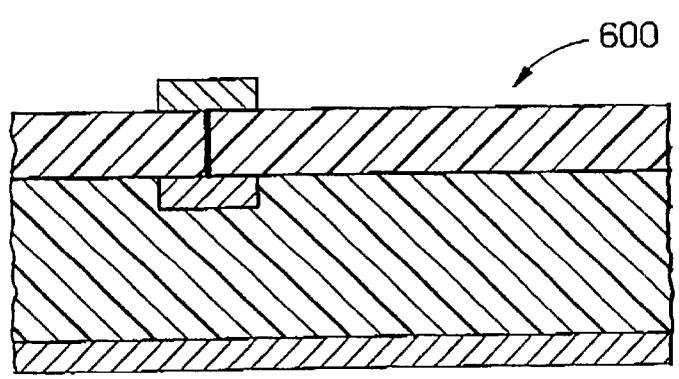
FIG. 6 shows a cross-section of an alternative arrangement according to the present invention, seen in a section similar to that of FIG. 5.

An alternative microstrip arrangement 600 according to the invention, used as a conductor, is shown in FIG. 6. As is the case in conventional microstrip arrangements, the embodiment in FIG. 6 comprises a first conductor 633, a ground plane 645 and a first layer 690 of dielectric material with a first dielectric constant $\epsilon_1$, which first layer is located between the first conductor 633 and the ground plane 654 of the arrangement. The microstrip arrangement 600 differs from conventional microstrip arrangements in that it additionally comprises a second conductor 633' and a second layer 680 of dielectric material, which second layer is located between the first and the second conductor.

The second conductor 633' extends essentially parallel to the first conductor 633 on the opposite side of the second layer 680 of dielectric material and has essentially the same dimensions as the first conductor 633 in its longitudinal direction and transverse direction.

The second conductor 633' is galvanically connected to the first conductor 633 by means of at least one connection 640.

The second layer 680 of dielectric material has a second dielectric constant $\epsilon_2$, preferably greater or smaller than the first dielectric constant $\epsilon_1$ of the first dielectric layer 690.

The microstrip arrangement 600 will be perceived electrically as a continuous conductor with a thickness that is essentially the same as the distance between the two surfaces located furthest from one another of the two conductors 633, 633'. This reduces the resistance of the conductor 630, which is of course advantageous. Furthermore, the losses in the first dielectric layer 690 will, in the same way as in the embodiments in FIGS. 1–5, be reduced considerably, which makes it possible to use as material in the first dielectric layer 690 material which would produce relatively high losses in a conventionally constructed microstrip arrangement.

What has been said about the galvanic connections between the two conductors according to the invention with reference to the embodiments in FIGS. 1–5 also applies for the embodiment shown in FIG. 6.

A description follows below of a number of possibilities which apply generally for a microstrip arrangement according to the invention, in other words for all the embodiments shown above, that is to say an antenna application, a circuit board application and a conductor application.

The connection between the two microstrip conductors may be designed in a great many different ways. One possibility is, for example, to interconnect the first and second microstrip conductors with the aid of a continuous connection which preferably extends in the longitudinal direction of the conductors, essentially along the length of the entire arrangement. In other words, such a connection forms a longitudinal groove of electrically conductive material.

A further possibility for interconnecting the first and the second microstrip conductors is to have one or more connections which extend(s) along all or parts of the outer edges of the conductors.

Figure 7:
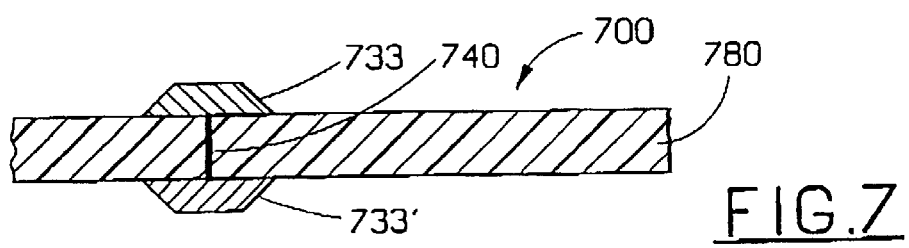
FIG. 7 shows a cross-section of a further alternative arrangement according to the present invention, seen in a section similar to that of FIG. 5.

A method of further reducing the losses in a microstrip arrangement according to the invention is to make the edges of the two conductors forming part of the invention bevelled, in other words letting them form an angle with the intermediate dielectric that is greater or smaller than a right angle. This is shown schematically in FIG. 7, with two beveled conductors 733, 733' on either side of a dielectric layer 780, which are galvanically interconnected via at least one connection 740.

The invention is not limited to the embodiments described above but may be varied within the scope of the patent claims below. A microstrip arrangement according to the invention may be used in principle in all applications where it is desirable to minimize the influence of the dielectric material.

What is claimed is:

1. An antenna arrangement comprising:
   a first ground plane;
   a second ground plane separated from the first ground plane by at least a first and a second dielectric material, the second ground plane being substantially parallel to the first ground plane and having at least one opening;
   a first microstrip conductor substantially parallel to the first and second ground planes and having substantially the same dimensions in the longitudinal and transverse directions as the at least one opening in the second ground plane;
   a second microstrip conductor separated from the first microstrip conductor by at least a portion of the first dielectric material and galvanically coupled to the first microstrip conductor by at least one connector, the second microstrip conductor having substantially the same dimensions in the longitudinal and transverse directions as the first microstrip conductor and being substantially parallel to the first microstrip conductor; and at least one radiating device, separated from the second ground plane by a third dielectric material;

wherein the first and second microstrip conductors and the at least one connector form a microstrip arrangement separated from each of the ground planes by the second dielectric material, the first and second microstrip conductors being substantially aligned with the at least one opening of the second ground plane in a direction perpendicular to the conductors, such that energy radiated from the microstrip arrangement is electro-magnetically coupled to the at least one radiating device.

2. The antenna arrangement according to claim 1, wherein at least one of the first and second microstrip conductors extends in the longitudinal and transverse directions into a cavity formed in the second dielectric material.

3. The antenna arrangement according to claim 1, wherein the at least one connector is comprised of a plurality of via holes.

4. The antenna arrangement according to claim 3, wherein the via holes are positioned substantially in the center of the microstrip conductors in relation to the longitudinal directions of the conductors and are spaced at a maximum distance of $\lambda/8$ from one another, where $\lambda$ is a wavelength at which the microstrip arrangement is principally intended to operate.

5. The antenna arrangement according to claim 1, wherein the at least one connector is comprised of a continuous connection positioned substantially in the center of the microstrip conductors in relation to the longitudinal directions of the conductors.

6. The antenna arrangement according to claim 1, wherein the at least one connector is positioned to extend along at least a portion of the outer edges of the microstrip conductors.

7. The antenna arrangement according to claim 1, wherein the at least one radiating device is comprised of at least one patch element that is electro-magnetically coupled to the microstrip arrangement.

8. The antenna arrangement according to claim 1, wherein the outer edges of the microstrip conductors are beveled.

9. The antenna arrangement according to claim 1, wherein the first dielectric material and the second dielectric material comprise the same type of material to form a single dielectric layer having a first thickness between the first and second ground planes and a second thickness between the first and second microstrip conductors.

* * * * *